（12） United States Patent
Chuang et al.

(10) Patent No.: US 9,224,688 B2
(45) Date of Patent: Dec. 29, 2015

(54) METAL ROUTING ARCHITECTURE FOR INTEGRATED CIRCUITS

(71) Applicant: Taiwan Semiconductor Manufacturing Company, Ltd., Hsin-Chu (TW)

(72) Inventors: Chita Chuang, Kaohsiung (TW); Yao-Chun Chuang, Hsin-Chu (TW); Chih-Hua Chen, Jhubei (TW); Chen-Cheng Kuo, Chu-Pei (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 319 days.

(21) Appl. No.: 13/734,573

(22) Filed: Jan. 4, 2013

(65) Prior Publication Data

US 2014/0191390 A1   Jul. 10, 2014

(51) Int. Cl.
*H01L 23/48* (2006.01)
*H01L 23/52* (2006.01)
*H01L 29/40* (2006.01)
*H01L 23/528* (2006.01)
*H01L 23/31* (2006.01)
*H01L 23/00* (2006.01)

(52) U.S. Cl.
CPC ........... *H01L 23/528* (2013.01); *H01L 23/3192* (2013.01); *H01L 24/05* (2013.01); *H01L 24/13* (2013.01); *H01L 24/16* (2013.01); *H01L 2224/02375* (2013.01); *H01L 2224/03826* (2013.01); *H01L 2224/03912* (2013.01); *H01L 2224/0401* (2013.01); *H01L 2224/05005* (2013.01); *H01L 2224/05008* (2013.01); *H01L 2224/05022* (2013.01); *H01L 2224/05124* (2013.01); *H01L 2224/05166* (2013.01); *H01L 2224/05541* (2013.01); *H01L 2224/05552* (2013.01); *H01L 2224/05572* (2013.01); *H01L 2224/05582* (2013.01); *H01L 2224/05647* (2013.01); *H01L 2224/1146* (2013.01); *H01L 2224/1147* (2013.01); *H01L 2224/13012* (2013.01); *H01L 2224/13083* (2013.01); *H01L 2224/13111* (2013.01); *H01L 2224/13144* (2013.01); *H01L 2224/13147* (2013.01); *H01L 2224/13155* (2013.01); *H01L 2224/13164* (2013.01); *H01L 2224/16* (2013.01); *H01L 2224/16145* (2013.01); *H01L 2224/16238* (2013.01); *H01L 2224/81815* (2013.01)

(58) Field of Classification Search
CPC ........... H01L 2924/01079; H01L 2924/01029; H01L 2924/01013; H01L 24/02; H01L 24/10; H01L 24/13; H01L 2924/01033
USPC .......... 257/E23.021, E23.033, 737, 778–781, 257/786, 738; 438/108, 612–614, 666
See application file for complete search history.

(56) References Cited

U.S. PATENT DOCUMENTS 5,900,643 A * 5/1999 Preslar et al. ................... 257/48
6,118,180 A * 9/2000 Loo et al. ...................... 257/737

(Continued)

*Primary Examiner* — Kenneth Parker
*Assistant Examiner* — Fang-Xing Jiang
(74) *Attorney, Agent, or Firm* — Slater & Matsil, L.L.P.

(57) ABSTRACT

A device includes a substrate, a metal pad over the substrate, and a metal trace electrically disconnected from the metal pad. The metal pad and the metal trace are level with each other. A passivation layer includes a portion overlapping an edge portion of the metal pad. A metal pillar is overlying the metal pad, and is electrically connected to the metal pad. The metal trace has a portion overlapped by the metal pillar.

20 Claims, 6 Drawing Sheets

(56) References Cited

U.S. PATENT DOCUMENTS

| | | | |
|---|---|---|---|
| 6,150,725 A * | 11/2000 | Misawa et al. | 257/781 |
| 6,465,886 B1 * | 10/2002 | Horiuchi et al. | 257/738 |
| 6,636,313 B2 * | 10/2003 | Chen et al. | 356/401 |
| 6,927,156 B2 * | 8/2005 | Mathew | 438/612 |
| 6,940,179 B2 * | 9/2005 | Lee | 257/780 |
| 7,098,540 B1 * | 8/2006 | Mohan et al. | 257/773 |
| 7,385,289 B2 * | 6/2008 | Suzuki | 257/758 |
| 7,642,646 B2 * | 1/2010 | Nakamura et al. | 257/737 |
| 8,227,926 B2 * | 7/2012 | Topacio et al. | 257/786 |
| 8,508,043 B2 * | 8/2013 | Daubenspeck et al. | 257/737 |
| 8,647,974 B2 * | 2/2014 | Topacio et al. | 438/612 |
| 8,736,079 B2 * | 5/2014 | Chen et al. | 257/784 |
| 9,059,159 B2 * | 6/2015 | Topacio et al. | 1/1 |
| 2002/0043723 A1 * | 4/2002 | Shimizu et al. | 257/758 |
| 2007/0290343 A1 * | 12/2007 | Harada et al. | 257/737 |
| 2010/0187688 A1 * | 7/2010 | Hochstenbach | 257/738 |
| 2011/0221065 A1 * | 9/2011 | Topacio et al. | 257/773 |

* cited by examiner

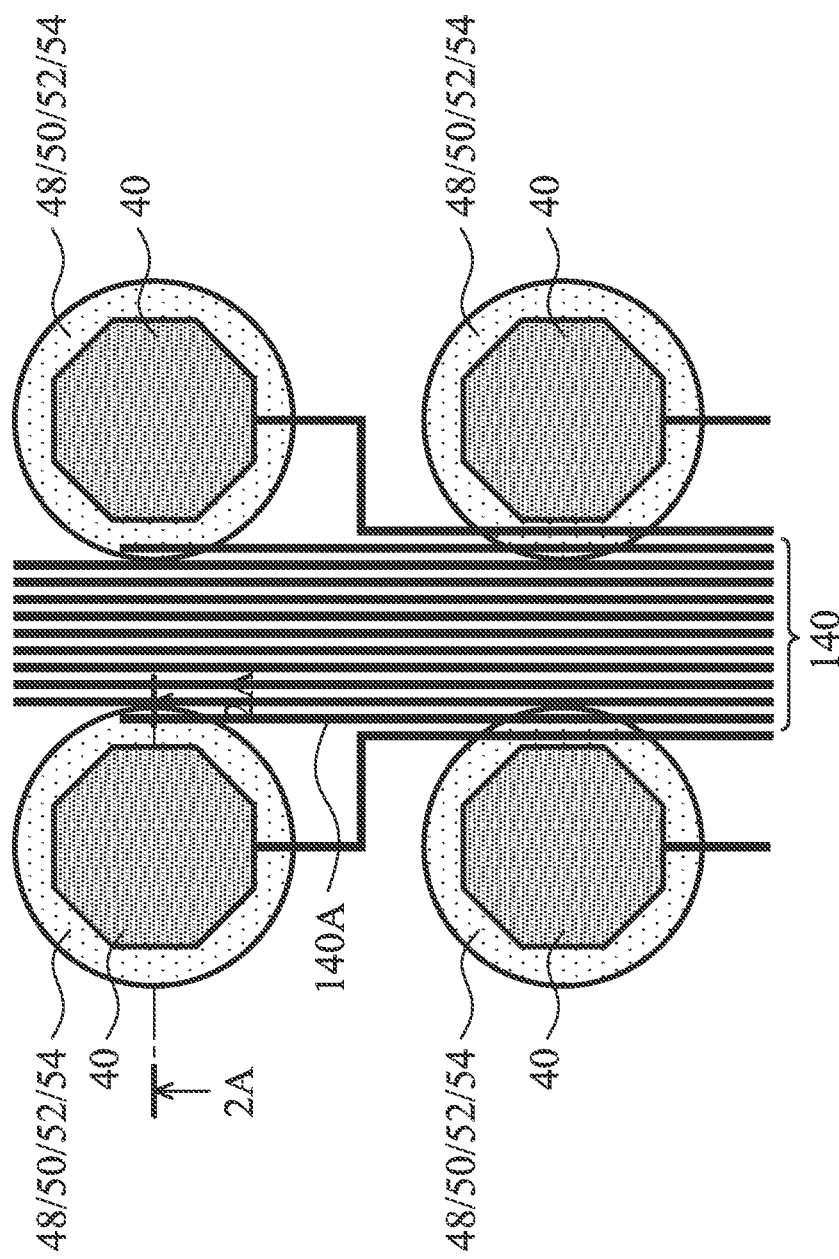

METAL ROUTING ARCHITECTURE FOR INTEGRATED CIRCUITS

BACKGROUND

Integrated circuits are made up of literally millions of active devices such as transistors and capacitors. These devices are initially isolated from each other, and are later interconnected to form functional circuits. Typical interconnect structures include lateral interconnections, such as metal lines (wirings), and vertical interconnections, such as vias and contacts.

On top of the interconnect structures, connector structures are formed. Connector structures include bond pads or metal bumps formed and exposed on the surface of the respective chip. Electrical connection is made through the bond pads or metal bumps to connect the chip to a package substrate or another die. The electrical connection may be made through wire bonding or flip-chip bonding.

One type of the connector structures includes an aluminum pad, which is electrically connected to the respective underlying interconnect structure. A passivation layer and a polymer layer are formed, with portions of the passivation layer and the polymer layer covering edge portions of the aluminum pad. An Under-Bump Metallurgy (UBM) is formed to extend into an opening in the passivation layer and the polymer layer. A solder ball may be formed on the UBM.

BRIEF DESCRIPTION OF THE DRAWINGS

For a more complete understanding of the embodiments, and the advantages thereof, reference is now made to the following descriptions taken in conjunction with the accompanying drawings, in which:

FIG. 2B illustrates a top view of the structure in FIG. 1B.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A device including a connector structure is provided in accordance with various exemplary embodiments. The variations of the embodiments are discussed. Throughout the various views and illustrative embodiments, like reference numbers are used to designate like elements.

Figure 1A:
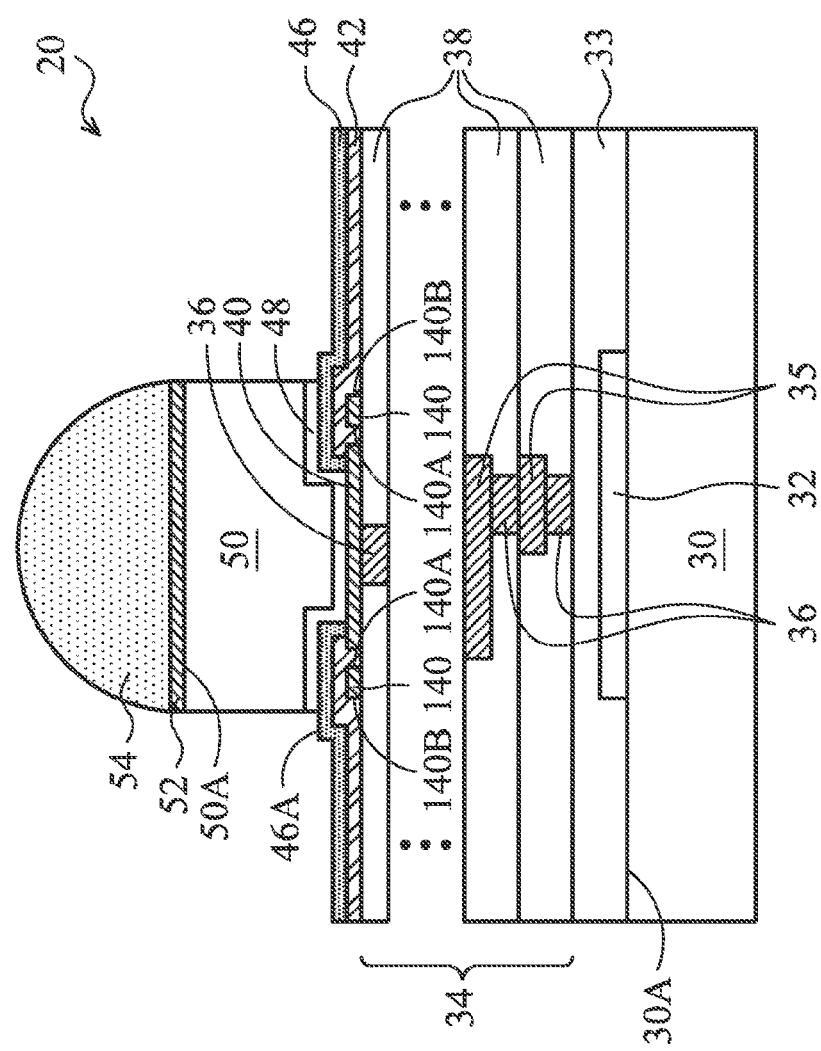
FIG. 1A is a cross-sectional view of a device including a connector structure in accordance with some exemplary embodiments.

FIG. 1A illustrates a cross-sectional view of package component 20 in accordance with exemplary embodiments. In some embodiments, package component 20 is a device die. Semiconductor substrate 30 in accordance with these embodiments may be a bulk silicon substrate or a silicon-on-insulator substrate. Alternatively, other semiconductor materials including group III, group IV, and group V elements may also be included in semiconductor substrate 30. Integrated circuit 32 is formed at surface 30A of semiconductor substrate 30. Integrated circuit 32 may include Complementary Metal-Oxide-Semiconductor (CMOS) devices therein. In alternative embodiments, package component 20 is an interposer die, a package substrate, and/or the like. In the embodiments wherein package component 20 is an interposer die, package component 20 does not include active devices such as transistors therein. Package component 20 may include passive devices such as resistors and capacitors, or free from passive devices in some embodiments.

In the embodiments wherein package components 20 is a device die, package component 20 may further include Inter-Layer Dielectric (ILD) 33 over semiconductor substrate 30, and interconnect structure 34 over ILD 33. Interconnect structure 34 includes dielectric layers 38, and metal lines 35 and vias 36 formed in dielectric layers 38. In some embodiments, dielectric layers 38 are formed of low-k dielectric materials. The dielectric constants (k values) of the low-k dielectric materials may be less than about 2.8, or less than about 2.5, for example. Metal lines 35 and vias 36 may be formed of copper, a copper alloy, or other metal-containing conductive materials. Metal lines 35 and vias 36 may be formed using single damascene and/or dual damascene processes.

Metal pad 40 is formed over interconnect structure 34, and may by electrically coupled to circuit 32 through metal lines 35 and vias 36 in interconnect structure 34. Metal pad 40 may be an aluminum pad or an aluminum-copper pad. For example, metal pad 40 may comprise between about 1 percent and about 100 percent aluminum (in which case metal pad 40 is an aluminum pad), and less about 1 percent copper, for example. In some embodiments, the metal feature 36 that is underlying and contacting metal pad 40 is a metal line. In alternative embodiments, the metal feature 36 that is underlying and contacting metal pad 40 is a metal via.

In addition to metal pad 40, metal traces 140 are also formed at the same level as metal pad 40. Metal pad 40 and metal traces 140 are formed of a same material, and may be formed simultaneously, for example, by depositing an aluminum-copper layer, and then patterning the aluminum-copper layer to form metal pad 40 and metal traces 140. Metal pad 40 is electrically disconnected from metal traces 140. As a result, during the operation of package component 20, metal pad 40 may have a voltage level different from the voltage levels of metal traces 140.

Passivation layer 42 is formed to cover the edge portions of metal pad 40. The central portion of metal pad 40 is exposed through an opening in passivation layer 42. Passivation layer 42 may be formed of a non-porous material. In some embodiments, passivation layer 42 is a composite layer comprising a silicon oxide layer (not shown), and a silicon nitride layer (not shown) over the silicon oxide layer. In alternative embodiments, passivation layer 42 comprises Un-doped Silicate Glass (USG), silicon oxynitride, and/or the like. Although one passivation layer 42 is shown, there may be more than one passivation layer.

Polymer layer 46 is formed over passivation layer 42 and covers passivation layer 42. Polymer layer 46 may comprise a polymer such as an epoxy, polyimide, benzocyclobutene (BCB), polybenzoxazole (PBO), and the like. Polymer layer 46 is patterned to form an opening, through which metal pad 40 is exposed.

Under-Bump Metallurgy (UBM) 48 is formed over metal pad 40. UBM 48 comprises a first portion over polymer layer 46, and a second portion extending into the openings in polymer layer 46 and passivation layer 42 to contact metal pad 40. In some embodiments, UBM 48 includes a titanium layer and a seed layer that is formed of copper or a copper alloy.

In accordance with some embodiments, metal pillar 50 is formed over UBM 48, and is co-terminus with UBM 48. For example, each of the edges of metal pillar 50 is aligned to corresponding edges of UBM 48. Accordingly, the lateral dimensions of metal pillar 50 are also equal to the respective lateral dimensions of UBM 48. UBM 48 may be in physical contact with metal pillar 50. In some exemplary embodiments, metal pillar 50 is formed of a non-reflowable metal(s) that does not melt in reflow processes. For example, metal pillar 50 may be formed of copper or a copper alloy. The top surface 50A of metal pillar 50 is higher than top surface 46A of polymer layer 46.

In addition to the illustrated metal pillar 50, there may be additional metal layers such as metal layer 52 formed on metal pillar 50, wherein metal layer 52 may include a nickel layer, a palladium layer, a gold layer, or multi-layers thereof. In these embodiments, metal layer 52 may also be considered as a portion of metal pillar 50. Solder cap 54 may also be formed over metal layer 52, wherein solder cap 54 may be formed of a Sn—Ag alloy, a Sn—Cu alloy, a Sn—Ag—Cu alloy, or the like, and may be a lead-free solder cap or a lead-containing solder cap.

In some exemplary embodiments, the formation of UBM 48, metal pillar 50, and metal layer 52 include performing an Physical Vapor Deposition (PVD) to form a blanket UBM layer (not shown, wherein UBM 48 is a portion of the UBM layer), and forming and patterning a mask layer (not shown) over the blanket UBM layer. The mask layer may be a photo resist or a dry film. Metal pillar 50, metal layer 52, and solder cap 54 are then formed in an opening of the mask layer, through which opening the blanket UBM layer is exposed. The exemplary formation process includes plating. After the formation of metal pillar 50, metal layer 52, and solder cap 54, the mask layer is removed. The portions of UBM layer that are covered by the patterned mask layer are removed, leaving Metal pillar 50, metal layer 52, and solder cap 54 un-removed. A reflow may be performed, so that solder cap 54 has a round top surface.

Figure 2A:
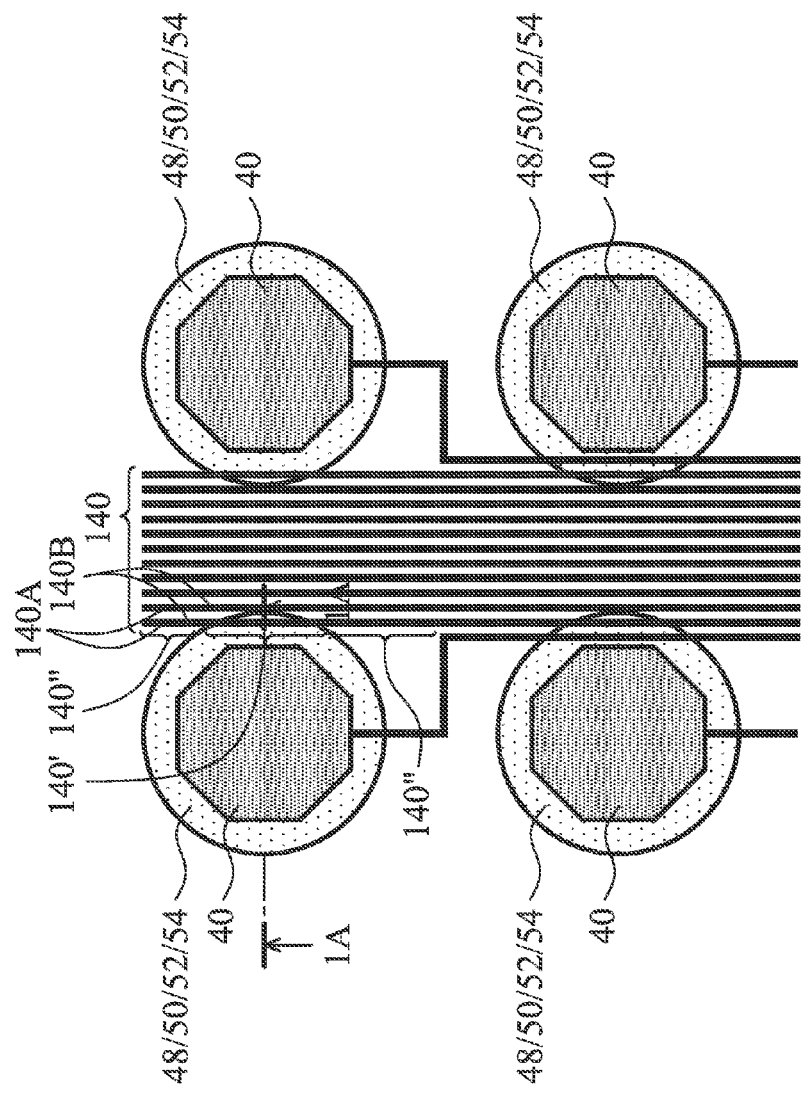
FIG. 2A illustrates a top view of the structure in FIG. 1A.

UBM 48 and metal pillar 50 overlap at least a portion of metal pad 40, and may also overlap an entirety of metal pad 40 (refer to FIG. 2A). Metal traces 140 extend underlying UBM 48 and metal pillar 50. Accordingly, a portion of each of metal traces 140 is overlapped by UBM 48 and metal pillar 50. Each of metal traces 140 has opposite edges 140A and 140B. In some embodiments, UBM 48 and metal pillar 50 overlap both edges 140A and 140B of one or more of metal traces 140. In alternative embodiments, UBM 48 and metal pillar 50 may overlap edge 140A, and do not overlap any portion of edge 140B, of one metal trace 140.

FIG. 2A illustrates a top view of the structure in FIG. 1A, wherein the cross-sectional view in FIG. 1A is obtained from the plane crossing line 1A-1A in FIG. 2A. FIG. 2A shows that metal traces 140 may comprise portion 140' overlapped by UBM 48 and metal pillar 50. Furthermore, metal traces 140 may further include portions 140" that are not overlapped by UBM 48 and metal pillar 50. In the illustrated top view, UBM 48 and metal pillar 50 have a circular top-view shape. In alternative embodiments, UBM 48 and metal pillar 50 also have other top-view shapes such as ellipses, rectangles, hexagons, octagons, or the like. Similarly, although metal pad 40 is illustrated as having an octagon top-view shape. In alternative embodiments, metal pad 40 may also have other top-view shapes such as circles, ellipses, rectangles, hexagons, or the like.

Furthermore, in some embodiments, as in FIG. 2A, each of metal traces 140 include two end portions 140" that are not overlapped by the corresponding UBM 48 and metal pillar 50. In alternative embodiments, one or more of metal traces 140 may have a single end portion 140" not covered by the corresponding UBM 48 and metal pillar 50, as shown in FIG. 2B, wherein the respective one of metal traces 140 is also marked as 140A.

Figure 1B:
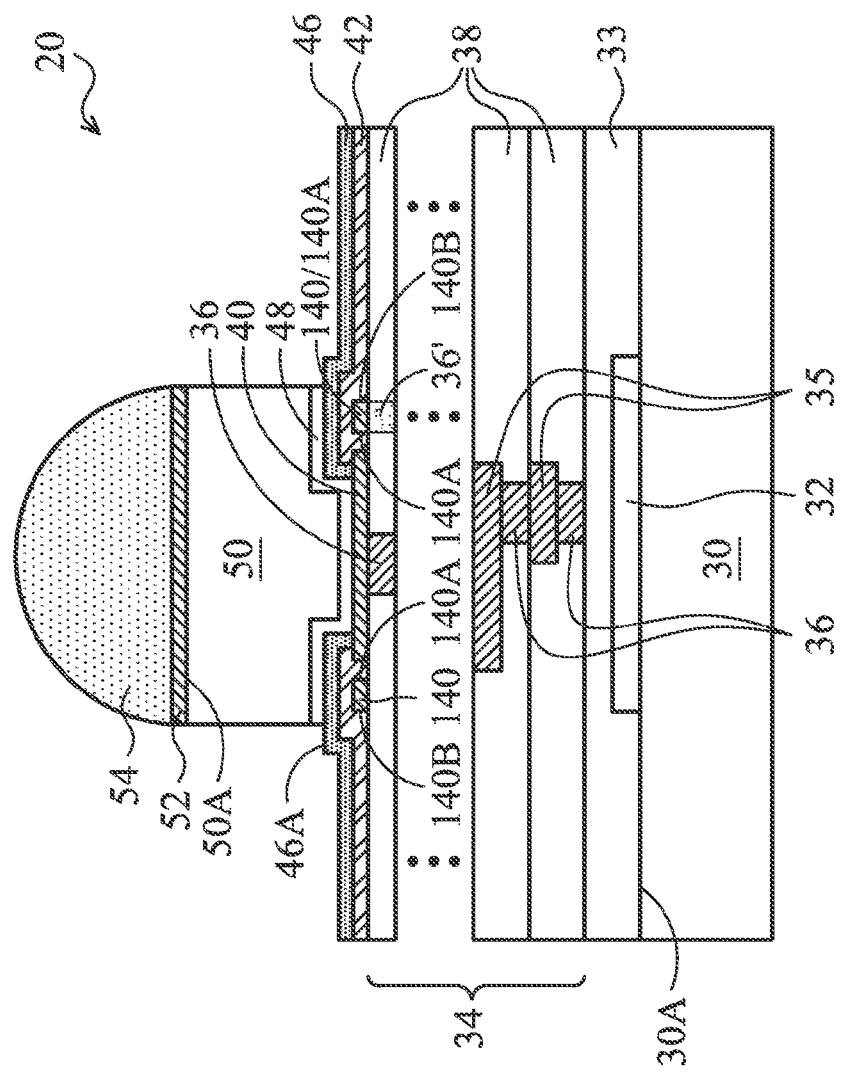
FIG. 1B is a cross-sectional view of a device including a connector structure in accordance with some alternative embodiments.

FIG. 1B illustrates a cross-sectional view of the structure shown in FIG. 2B, wherein the cross-sectional view is obtained from the plane crossing line 2A-2A in FIG. 2B. The structure in FIG. 1B is similar to the structure in FIG. 1A, except that metal line or via 36' is underlying and connected to one of metal traces 140. Metal line/via 36' is also overlapped by UBM 48 and metal pillar 50.

It is appreciated that although in FIGS. 2A and 2B, two metal traces 140 extend underlying each of UBM 48 and metal pillar 50, the number of metal traces 140 that extend underlying each of UBM 48 and metal pillar 50 may be any integer number such as one, three, four, five, or greater.

Figure 3:
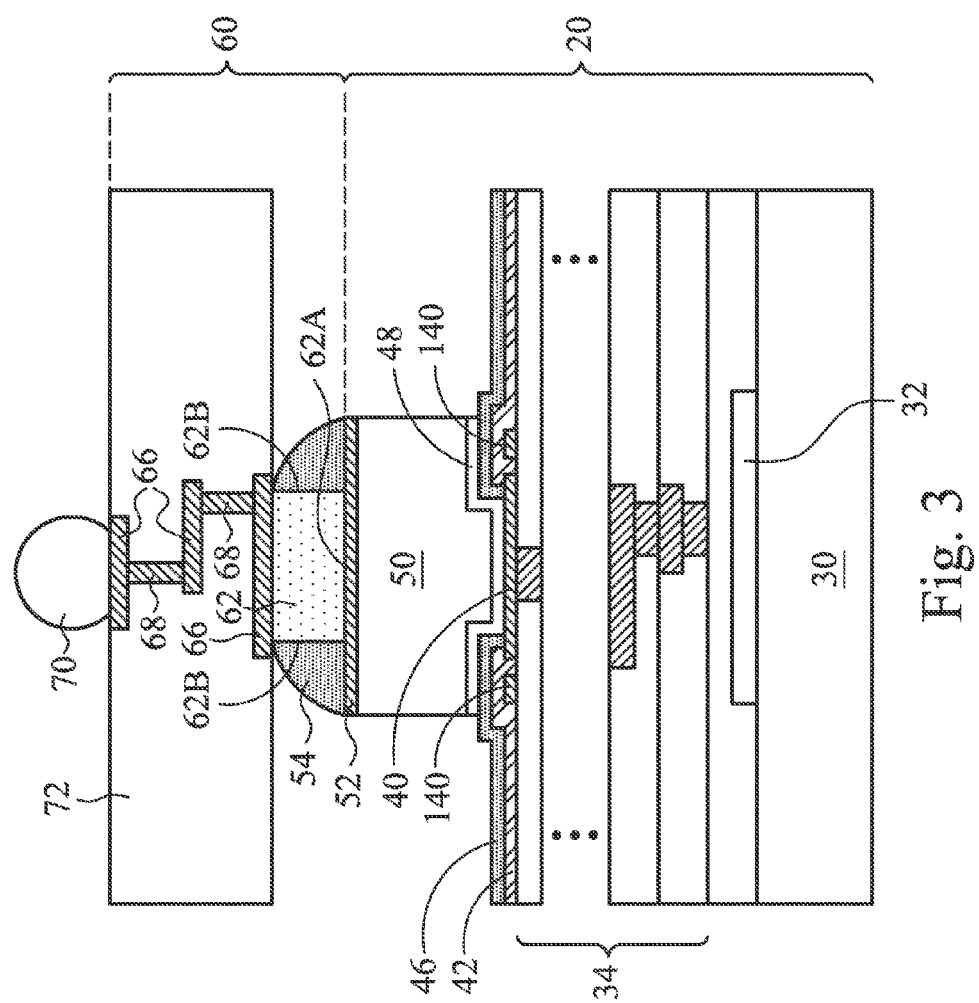
FIG. 3 illustrates the bonding of the device in FIG. 1 to a package substrate.

FIG. 3 illustrates the bonding of metal pillar 50 to metal trace 62 of package component 60. In some embodiments, the bonding is performed through a Bump-On-Trace (BOT) bonding scheme. Package component 60 may be a package substrate, which may be a laminate substrate or a build-up substrate in accordance with some embodiments. For example, package component 60 may include a plurality of dielectric layers, and metal lines and vias (not shown) embedded in the dielectric layers. In alternative embodiments, package component 60 is a device die, a package, an interposer die, or the like. In the embodiments wherein the bonding is performed through the BOT bonding scheme, solder region 54 is bonded to, and in contact with, surface 62A and sidewalls surfaces 62B of metal trace 62. In these embodiments, metal trace 62 may have a uniform width, wherein the portion of metal trace 62 that is in contact with solder region 54 may have a same width as the portions of metal trace 62 that are not in contact with solder region 54.

In some embodiments, package component 60 comprises metal lines (or metal pads) 66 and via 68 electrically coupling connector 70 to metal trace 62, wherein connector 70 and metal trace 62 are on opposite sides of package component 60. Connector 70 may be a solder ball, a metal pillar, or a composite metal connector including a metal pillar and a solder cap. Metal lines 66 and via 68 may be routed through a plurality of dielectric layers 72, which may be organic dielectric layers or non-organic dielectric layers.

Figure 4:
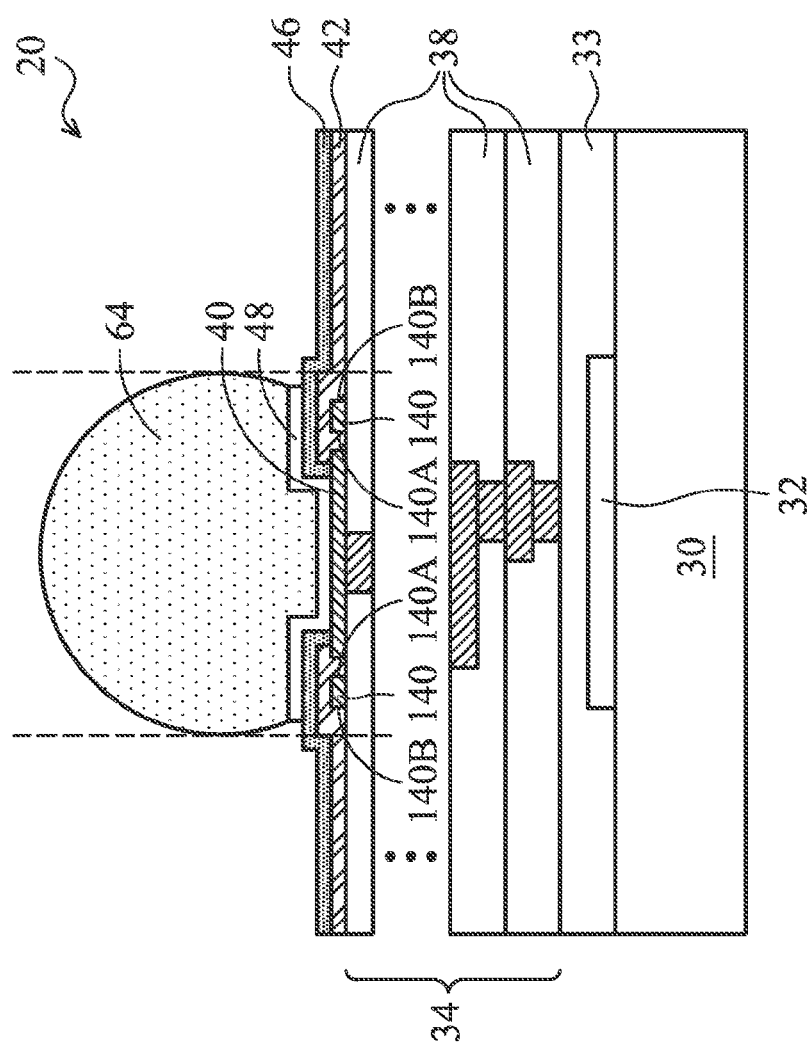
FIG. 4 illustrates a cross-sectional view of a device including a solder ball in accordance with alternative embodiments.

In the embodiments shown in FIGS. 1 and 3, over UBM 48 resides a non-reflowable metal pillar 50. In alternative embodiments, as shown in FIG. 4, solder ball 64 is formed over and contacting UBM 48. These embodiments are essentially the same as the embodiments shown in FIGS. 1 and 3, except that solder ball 64 replaces metal pillar 50 and the overlying metal layer 52 and solder cap 54 (FIGS. 1A and 1B), if any. In these embodiments, metal traces 140 extend underlying and overlapped by solder ball 64. Furthermore, solder ball 64 may overlap one edge or both edges 140A and 140B of one or both of metal traces 140.

In the embodiments, by allowing metal traces 140 to extend underlying UBM 48 and the overlying metal pillar 50 (FIGS. 1A and 1B) or solder ball 64 (FIG. 4), the routing flexibility of metal traces 140 is increased over conventional structures, in which the metal traces are not allowed to route underlying the UBMs, metal pillars, and solder balls. With the improved routing flexibility, more metal traces may be disposed on the chip, and/or more chip area may be reserved for adding more UBMs 48 and metal pillars 50.

In accordance with embodiments, a device includes a substrate, a metal pad over the substrate, and a metal trace electrically disconnected from the metal pad. The metal pad and the metal trace are level with each other. A passivation layer includes a portion overlapping an edge portion of the metal pad. A metal pillar is overlying the metal pad, and is electrically connected to the metal pad. The metal trace has a portion overlapped by the metal pillar.

In accordance with other embodiments, a device includes a substrate, a metal pad over the substrate, and a metal trace disconnected from the metal pad, wherein the metal pad and the metal trace are level with each other. A polymer layer includes a portion overlapping an edge portion of the metal pad. The metal trace has a first portion overlapped by an UBM, and a second portion not overlapped by the UBM. The UBM includes a first portion overlying and contacting the metal pad, wherein the first portion penetrates through the polymer layer, and a second portion overlying the polymer layer. A solder region is disposed overlying and electrically coupled to the UBM. A second metal trace is joined to the solder region, wherein the solder region is in contact with a bottom surface and sidewalls of the second metal trace.

In accordance with yet other embodiments, a device includes a substrate, an aluminum-containing pad over the substrate, and a metal trace disconnected from the aluminum-containing pad. The aluminum-containing pad and the metal trace are level with each other. A passivation layer covers edge portions of the aluminum-containing pad. A polymer layer is over the passivation layer and covers the edge portions of the aluminum-containing pad. An UBM includes a first portion extending into the passivation layer and the polymer layer to contact the aluminum-containing pad, and a second portion overlapping the polymer layer. A metal pillar is over the UBM, wherein edges of the metal pillar are aligned to respective edges of the UBM. The metal trace includes a portion vertically aligned to a portion of the UBM and a portion of the metal pillar.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a substrate;
    a metal pad over the substrate;
    a first metal trace electrically disconnected from the metal pad, wherein the metal pad and the first metal trace are level with each other;
    a passivation layer comprising a portion overlapping an edge portion of the metal pad;
    an Under-Bump Metallurgy (UBM) comprising a first portion extending into the passivation layer to contact the metal pad, and a second portion overlapping the passivation layer; and
    a metal pillar over the UBM, wherein edges of the metal pillar are aligned to respective edges of the UBM, and the first metal trace comprises a portion vertically aligned to a portion of the UBM and a portion of the metal pillar.

2. The device of claim 1 further comprising a solder cap overlying and contacting the metal pillar.

3. The device of claim 1, wherein the first metal trace further comprises an additional portion not overlapped by the UBM.

4. The device of claim 1, wherein the metal pad comprises aluminum and copper.

5. The device of claim 1 further comprising a second metal trace electrically disconnected from the metal pad, wherein the first metal trace and the second metal trace are on opposite sides of the metal pad, and wherein the second metal trace comprises a first portion overlapped by the metal pillar, and a second portion not overlapped by the metal pillar.

6. The device of claim 1 further comprising a polymer layer over the passivation layer and under a portion of the metal pillar, wherein the metal pillar is electrically coupled to the metal pad through an opening in the polymer layer.

7. The device of claim 1, wherein the first metal trace has a first edge and a second edge opposite to each other, and wherein each of the first and the second edges comprises a portion overlapped by the metal pillar.

8. A device comprising:
    a substrate;
    a metal pad over the substrate;
    a first metal trace disconnected from the metal pad, wherein the metal pad and the first metal trace are level with each other;
    a polymer layer comprising a portion overlapping an edge portion of the metal pad;
    an Under-Bump Metallurgy (UBM), wherein the first metal trace comprises a first portion overlapped by the UBM, and a second portion not overlapped by the UBM, and wherein the UBM comprises:
        a first portion overlying and contacting the metal pad, wherein the first portion of the UBM penetrates through the polymer layer; and
        a second portion overlying the polymer layer;
    a solder region overlying and electrically coupled to the UBM; and
    a second metal trace joined to the solder region, wherein the solder region is in contact with a bottom surface and sidewalls of the second metal trace.

9. The device of claim 8 further comprising a non-reflowable metal pillar overlying and the UBM, wherein the non-reflowable metal pillar is between, and in contact with, the UBM and the solder region.

10. The device of claim 8, wherein the UBM is comprised in a device die, and wherein the second metal trace is comprised in a package substrate.

11. The device of claim 8, wherein the first portion of the first metal trace is overlapped by the solder region.

12. The device of claim 8, wherein the metal pad comprises aluminum and copper.

13. The device of claim 8 further comprising a third metal trace electrically disconnected from the metal pad, wherein the first metal trace and the third metal trace are on opposite sides of the metal pad, and wherein the third metal trace comprises a first portion overlapped by the UBM, and a second portion not overlapped by the UBM.

14. The device of claim 8 further comprising a passivation layer underlying the polymer layer and overlapping the edge portion of the metal pad.

15. A device comprising:

a substrate;

an aluminum-containing pad over the substrate;

a first metal trace disconnected from the aluminum-containing pad, wherein the aluminum-containing pad and the first metal trace are level with each other;

a passivation layer covering edge portions of the aluminum-containing pad;

a polymer layer over the passivation layer and covering the edge portions of the aluminum-containing pad;

an Under-Bump Metallurgy (UBM) comprising a first portion extending into the passivation layer and the polymer layer to contact the aluminum-containing pad, and a second portion overlapping the polymer layer; and a metal pillar over the UBM, wherein edges of the metal pillar are aligned to respective edges of the UBM, and wherein the first metal trace comprises a portion vertically aligned to a portion of the UBM and a portion of the metal pillar.

16. The device of claim 15, wherein the first metal trace has a first edge and a second edge opposite to each other, and wherein each of the first and the second edges comprises a portion overlapped by the metal pillar.

17. The device of claim 15, wherein the first metal trace has a first edge and a second edge opposite to each other, and wherein the first edge comprises a portion overlapped by the metal pillar, and the second edge is not overlapped by the metal pillar.

18. The device of claim 15, wherein the passivation layer and the polymer layer further overlap the first metal trace.

19. The device of claim 15 further comprising a second metal trace disconnected from the aluminum-containing pad, wherein the first metal trace and the second metal trace are on opposite sides of the aluminum-containing pad, and wherein the second metal trace comprises a first portion overlapped by the UBM, and a second portion not overlapped by the UBM.

20. The device of claim 15 further comprising a solder cap over the metal pillar.

* * * * *